(12) United States Patent
Liu

(10) Patent No.: US 9,154,159 B2
(45) Date of Patent: Oct. 6, 2015

(54) LOW LATENCY DATA DESERIALIZER

(71) Applicant: INTERNATIONAL BUSINESS MACHINES CORPORATION, Armonk, NY (US)

(72) Inventor: Yong Liu, Rye, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/144,743

(22) Filed: Dec. 31, 2013

(65) Prior Publication Data

US 2015/0188567 A1   Jul. 2, 2015

(51) Int. Cl.
*H03M 9/00* (2006.01)
*H03K 3/037* (2006.01)

(52) U.S. Cl.
CPC ............... *H03M 9/00* (2013.01); *H03K 3/0372* (2013.01)

(58) Field of Classification Search
CPC ............................. H03M 9/00; H03K 3/0372
USPC ......................................................... 341/100
See application file for complete search history.

(56) References Cited

U.S. PATENT DOCUMENTS

| | | | |
|---|---|---|---|
| 4,901,076 A * | 2/1990 | Askin et al. | 341/100 |
| 6,970,115 B1 * | 11/2005 | Sardi et al. | 341/100 |
| 7,006,021 B1 | 2/2006 | Lombaard | |
| 7,049,983 B2 | 5/2006 | Azami et al. | |
| 7,253,754 B2 * | 8/2007 | Takeuchi et al. | 341/100 |
| 7,936,854 B2 | 5/2011 | Foley et al. | |
| 8,442,173 B2 | 5/2013 | Kenney | |
| 2009/0323731 A1 | 12/2009 | Lee et al. | |
| 2012/0154186 A1 | 6/2012 | Hassan | |

OTHER PUBLICATIONS

Tobajas, F., et al. "A Low Power 2.5 GBPS 1:32 Deserializer in Sige BICMOS Technology" Proceedings of the 9th IEEE Workshop on Design & Diagnostics of Electronic Circuits & Systems (DDECS 2006). Apr. 2006. (6 Pages).

* cited by examiner

*Primary Examiner* — Jean B Jeanglaude
(74) *Attorney, Agent, or Firm* — Tutunjian & Bitetto, P.C.; Anne V. Dougherty

(57) ABSTRACT

A deserializer includes an input interface configured to receive an N-bit serialized stream at a source clock frequency; a modified-tree deserializing architecture that receives the first N−1 bits of the serialized stream from the input interface and generates N−1 parallel outputs corresponding to the first N−1 bits; and a last-bit flip-flop that directly samples the input interface to obtain an Nth bit, such that all N bits are available within one source clock cycle after the Nth bit arrives at the input interface.

20 Claims, 7 Drawing Sheets

LOW LATENCY DATA DESERIALIZER

STATEMENT REGARDING FEDERALLY SPONSORED RESEARCH OR DEVELOPMENT

This invention was made with Government support under Contract No.: H98230-12-C-0325 (National Security Agency (NSA)). The Government has certain rights in this invention.

BACKGROUND

1. Technical Field

The present invention relates to the conversion of serial data streams to multi-bit parallel data streams and, more particularly, to a modified-tree data deserializer.

2. Description of the Related Art

In electronic systems and circuits, when data is transferred from one system to another, the source system and destination system may process data at different rates. In such a case, it may be beneficial to convert between serial data at a high data rate to parallel data that is processed at a lower rate.

When selecting a data deserializer, speed, latency, power, and chip area are all metrics of the utility of that component. In modern high-speed systems, for example, a data deserializer may need to work at data rates in the tens of gigabytes per second. When data is transferred from the input of the deserializer to the output, a certain time delay is introduced called the latency. Different applications will have different latency needs, and high-performance computing systems may need a very low latency. The power dissipation and the related chip area, meanwhile, need to be low to generally reduce system power consumption and cost.

One conventional type of deserializer is a tree-type deserializer, where data delay elements such as registers or latches are allocated in a hierarchical structure, with some elements being operated at a significantly lower frequency than the source clock frequency. The tree deserializer has a significant advantage over register shift desrializers in its power consumption, but because the data is delivered among a variety of different clock domains, the data latency increases. Conventional tree deserializers are then unsuitable for applications that need low latency.

SUMMARY

A deserializer includes an input interface configured to receive an N-bit serialized stream at a source clock frequency; a modified-tree deserializing architecture that receives the first N−1 bits of the serialized stream from the input interface and generates N−1 parallel outputs corresponding to the first N−1 bits; and a last-bit flip-flop that directly samples the input interface to obtain an Nth bit, such that all N bits are available within one source clock cycle after the Nth bit arrives at the input interface.

A deserializer includes an input flip-flop triggered at a source frequency, configured to receive an N-bit serialized stream at the source clock frequency; a modified-tree deserializing architecture, comprising N−1 output flip-flop triggered at 1/N of the source clock frequency, that receives the first N−1 bits of the serialized stream from the input interface and generates N−1 parallel outputs corresponding to the first N−1 bits; and a last-bit flip-flop, triggered at sub-rate frequency that is 1/N of the source clock frequency, that directly samples the input interface to obtain an Nth bit, such that all N bits are available within one source clock cycle after the Nth bit arrives at the input interface.

A deserialization method includes receiving an N-bit serialized stream at an input interface at a source clock frequency; deserializing the first N−1 bits of the the received N-bit serialized stream to generate N−1 parallel outputs; directly sampling the input interface to obtain an Nth bit; and providing an N-bit parallel output corresponding to the N-bit serialized stream within one source clock cycle after the Nth bit arrives at the input interface.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Embodiments of the present invention provide a modified tree data stream deserializer. The present embodiments achieve lower latency and lower power consumption than both conventional tree deserializers and conventional register shift deserializers. Data registers in the present embodiments are driven by clocks in different clock domains that range from a relatively high-frequency source clock to a low-frequency destination clock. To overcome the high data latency associated with conventional tree deserializers, the latest data bit is sampled directly by data registers (or latches) in the destination clock domain. This breaks the hierarchy between clock domains and removes extra delays between the clock domains. This allows the present embodiments to reach the low latencies available in shift-register deserializers and provides a power savings over conventional tree deserializers.

Figure 1:
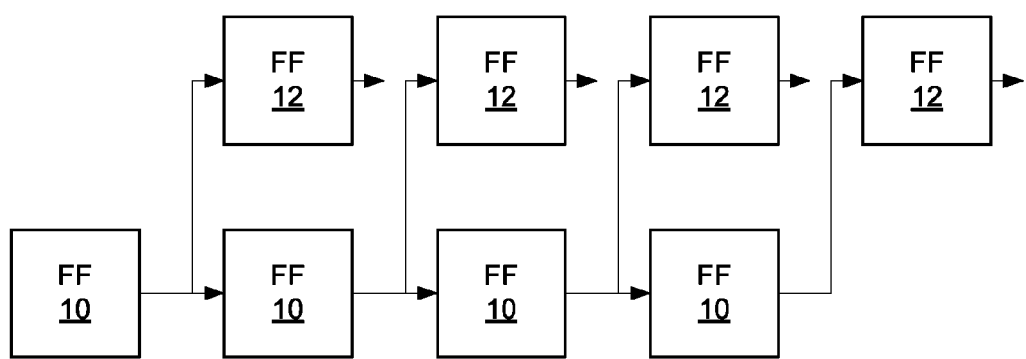
FIG. 1 is a block diagram of a conventional four-bit shift register deserializer.

Referring now to the drawings in which like numerals represent the same or similar elements and initially to FIG. 1, a conventional shift register deserializer is shown. The conventional shift register deserializer has a first set of input flip-flops 10 that accept an input signal and are triggered at a first clock rate C1. At each clock cycle, the input signal steps forward one flip-flop. In this four-bit example, a set of output flip-flops 12 captures the values of each of the input flip-flops 10, triggered by a clock C4 having one quarter the frequency of C1. In this manner a low-latency deserialization may be achieved. However, because there are four flip-flops 10 running at the full clock rate, the power needed to run this deserializer is relatively high. Each of the input flip-flops 10 will be triggered four times and each of the output flip-flops 12 will be triggered once to deserialize a four-bit input. If the power needed to trigger a flip-flop driven by clock C4 is $P_{FFC4}$, then the total power consumed for one deserialization will be $20P_{FFC4}$.

Figure 2:
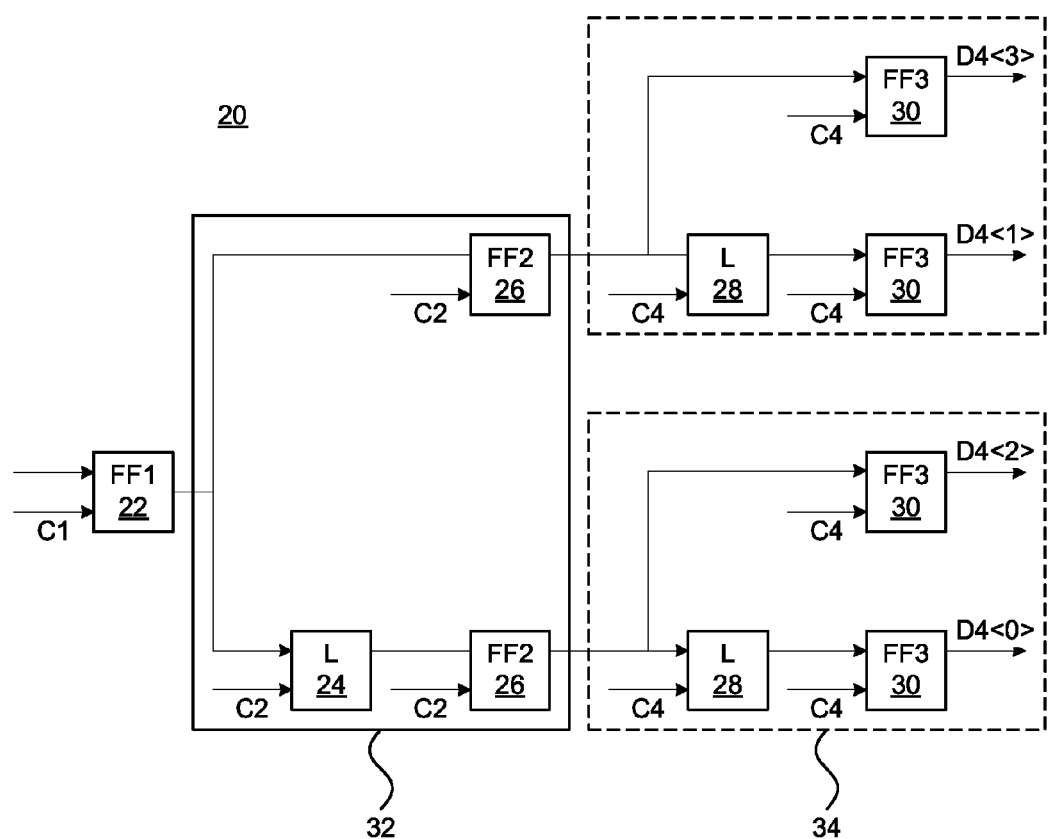
FIG. 2 is a block diagram of a conventional tree deserializer.

Referring now to FIG. 2, a conventional tree deserializer 20 is shown. The tree deserializer 20 is formed by a first two-to-one deserializer macro 32 and two second-level two-to-one deserializer macros 34. A serialized input signal is provided to an input flip-flop 22 triggered by a source clock C1. The first macro 32 splits that input into two branches, with one branch being delayed with respect to the other branch by latch 24. The delay latch 24 and the flip-flops 26 of the first macro 32 are each triggered by a half-rate clock C2. The outputs of the first macro 32 are used as the inputs to the two second-level macros 34. The second level macros 34 have a structure similar to the first macro 32, each having a latch 28 and two output flip-flops 30. The latches 28 and flip-flops 30 of the second-level macros 34 are triggered by a quarter-rate clock C4 to produce the output.

In the conventional tree deserializer 20, each latch 24/28 consumes one half the power of a flip-flop 26/30 being triggered at the same rate. As such, the power consumed by the conventional tree deserializer 20 is given by four flip-flops and two latches running at C4, two flip-flops and a latch running at C2, and one flip-flop running at C1. As a result, the power consumed by the conventional tree deserializer 20 is $13.5P_{FFC4}$. This is a substantial improvement over the shift register deserializer described above, but comes with its own drawbacks. In particular, the conventional tree deserializer 20 suffers from long latency, as there is a substantial delay between the arrival of the last bit at the input flip-flop 22 and its arrival at its output flip-flop 30.

It should be noted that the flip-flops described herein are master-slave flip-flops, each comprising two latches. A first latch in the flip-flop is the master latch and a second latch is the slave latch. When the clock of a latch is high, the latch is "transparent," and when the clock is low, the latch is in hold mode. This two-latch construction provides for simple waveform inversion, simply by interposing a single latch in a line, delaying the signal by a half cycle.

Figure 3:
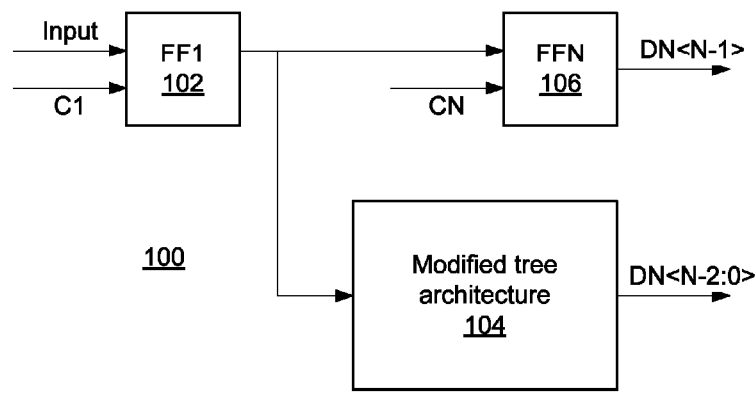
FIG. 3 is a block diagram of an N-bit modified-tree deserializer in accordance with the present principles.

Referring now to FIG. 3, a modified tree deserializer 100 is shown that address the power-consumption and latency concerns present in conventional deserializers. An input flip-flop 102 receives a serial data stream input and is triggered by a source clock C1 that runs at, e.g., the full clock rate of a system. The output of the input flip-flop 102 is provided to a modified tree architecture 104, which will be shown in greater detail below, and a latest-bit flip-flop 106 that is triggered by a slower clock CN. The latest-bit flip-flop 106 provides as its output the last bit in the set of serial bits to be deserialized, while the modified tree architecture 104 produces a parallel output that includes the remainder of the bits.

Consider, for example, a deserializer that turns four serial bits into four parallel bits. In such a case, N will be 4 and the modified tree architecture 104 will take the first three of every four bits. The latest-bit flip-flip 106 will have a clock CN that has a frequency one fourth that of the input clock C1, such that it triggers after the fourth bit arrives at input flip-flop 102. This makes the last bit in the sequence immediately available, rather than waiting for the bit to work its way through the tree. As a result, the present embodiments substantially reduce latency compared to conventional tree deserializers, which would need to wait until the last bit is fully processed before providing the parallel output word.

Figure 4:
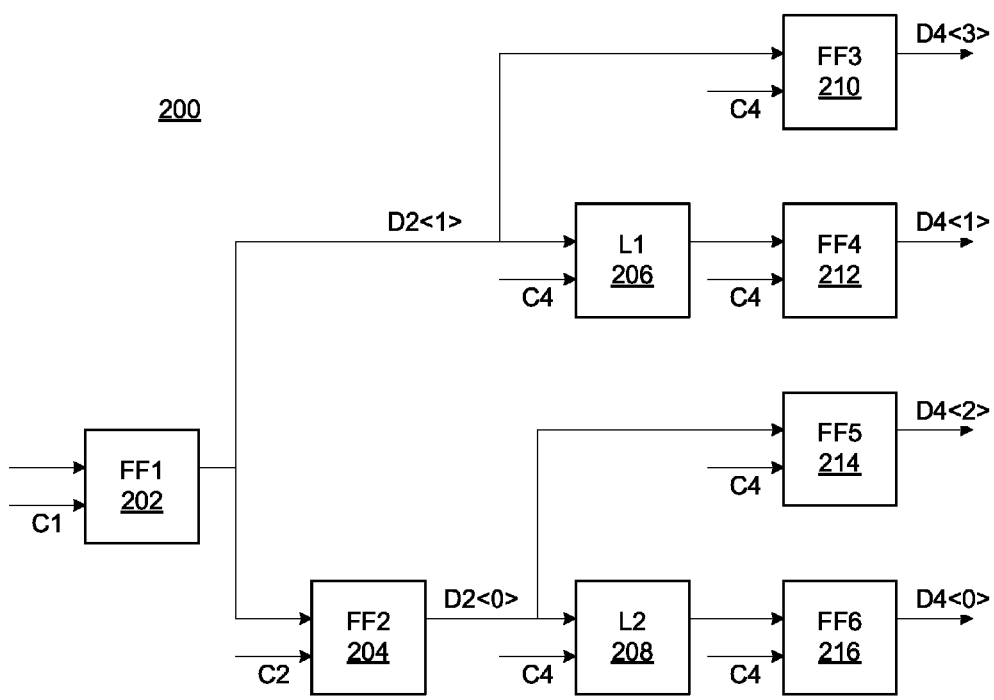
FIG. 4 is a block diagram of an 4-bit modified-tree deserializer in accordance with the present principles.

Referring now to FIG. 4, a low-latency, four-bit modified tree deserializer 200 is shown. An input flip-flop 202 receives a data stream that includes serialized data. A clock C1 samples the incoming data at a first clock rate. The output of the input flip-flop 202 is split into two branches. Considering the top branch first, this output is directly sampled by flip-flop 210, which corresponds to the latest-bit flip-flop 106 discussed above. The flip-flop 210 is triggered by a clock C4 running at one-fourth the speed of the source clock C1, such that it will always output the last of each four-bit sequence, D4<3>.

The other three bits of the sequence are captured by the modified tree architecture. A second-level flip-flop 204 samples every other bit output by the input flip-flop 202 using a clock C2B that runs at half the frequency of the input clock C1. The second-level flip-flop 204 therefore captures, e.g., the first and third bits of the sequence as its output, D2<0>. This second-level output is further broken down to individual bits by a two-to-one deserializer structure formed from delay latch 208 and two output flip-flops 214 and 216, each triggered by a clock C4 that runs at one quarter the frequency of the source clock C1. The delay latch 208 stores the first bit output as D2<0> and passes it on to the output flip-flop 216, while the output flip-flop 214 samples D2<0> directly. This results in output flip-flop 216 capturing the first bit of the sequence as D4<0> and output flip-flop 214 capturing the third bit of the sequence as D4<2>.

As noted above, the last bit in the sequence is captured directly by output flip-flop 210 as D4<3>. The second bit in the sequence is delayed by latch 206, triggered by clock C4, and provided to output flip-flop 212. The output flip-flop 212 captures the second bit and outputs it as D4<1>. As shown in the figure, each of the four bits is provided at the same time, triggered by clock C4, running at one-fourth the source clock rate. If the last bit D4<3> were not sampled directly and instead were sampled according to a conventional tree deserializer structure, the second-level flip-flop 204 and the connecting wire marked as D2<1> would have been replaced with a full two-to-one deserializer structure.

Figure 5:
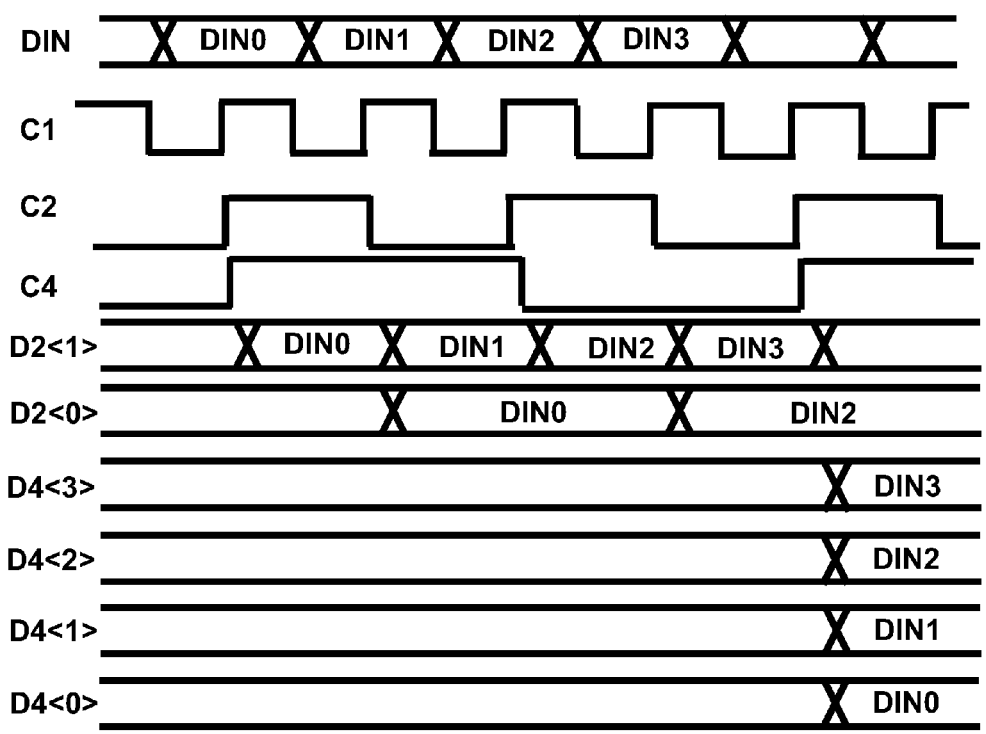
FIG. 5 is a timing diagram that shows the timing of clock and output signals in a 4-bit modified-tree deserializer in accordance with the present principles.

Referring now to FIG. 5, a timing waveform of the four-bit deserializer 200 is shown. The top waveform shows the input sequence as it arrives at input flip-flop 202. The three clocks, C1, C2, and C4 are shown below, with C2 having a frequency half that of C1 and C4 having a frequency half that of C2. The D2<1> line shows the direct output of the input flip-flop 202, while D2<0> shows the output of the second-level flip-flop 204. As can be seen, the slower clock C2 causes the second-level flip-flop 204 to output only the first and third input bits.

The last four lines indicate the timing of the four output bits. There is minimal latency between the last bit DIN3 being input and the fully deserialized set of bits D4<3:0> being output. The latency of the four-bit modified tree deserializer 200 may be characterized as $UI+t_{C1C4}+t_{clkq4}$, where UI is the unit interval of the input data stream, $t_{C1C4}$ is the time delay from clock C1 to clock C4, and $t_{clkq4}$ is the clock-to-q delay of a flip-flop driven by C4 (the time delay between being triggered by the clock and providing an output). Notably, this latency is the same as would be produced experienced in a conventional shift register deserializer and substantially lower than would be seen in a conventional tree deserializer. The total power may further more be characterized by counting triggers of the flip-flops, where the four-bit modified tree deserializer 200 has one flip-flop driven by C1, one flip-flop driven by C2, and four flip-flops driven by C4, and two latches driven by C4. If the power needed to trigger a flip-flop (which is formed from two latches) driven by C4 is $P_{FFC4}$, then the total power consumed by the four-bit modified tree deserializer 200 is only $11P_{FFC4}$ (assuming that the flip-flop power is linearly proportional to its clock frequency), a substantial improvement over the $16P_{FFC4}$ used by a conventional four-bit tree deserializer and the $20P_{FFC4}$ used by a conventional shift register deserializer. As such, the modified tree deserializer disclosed herein provides substantial benefits over conventional deserialziers, both in latency and in power consumption.

Figure 6:
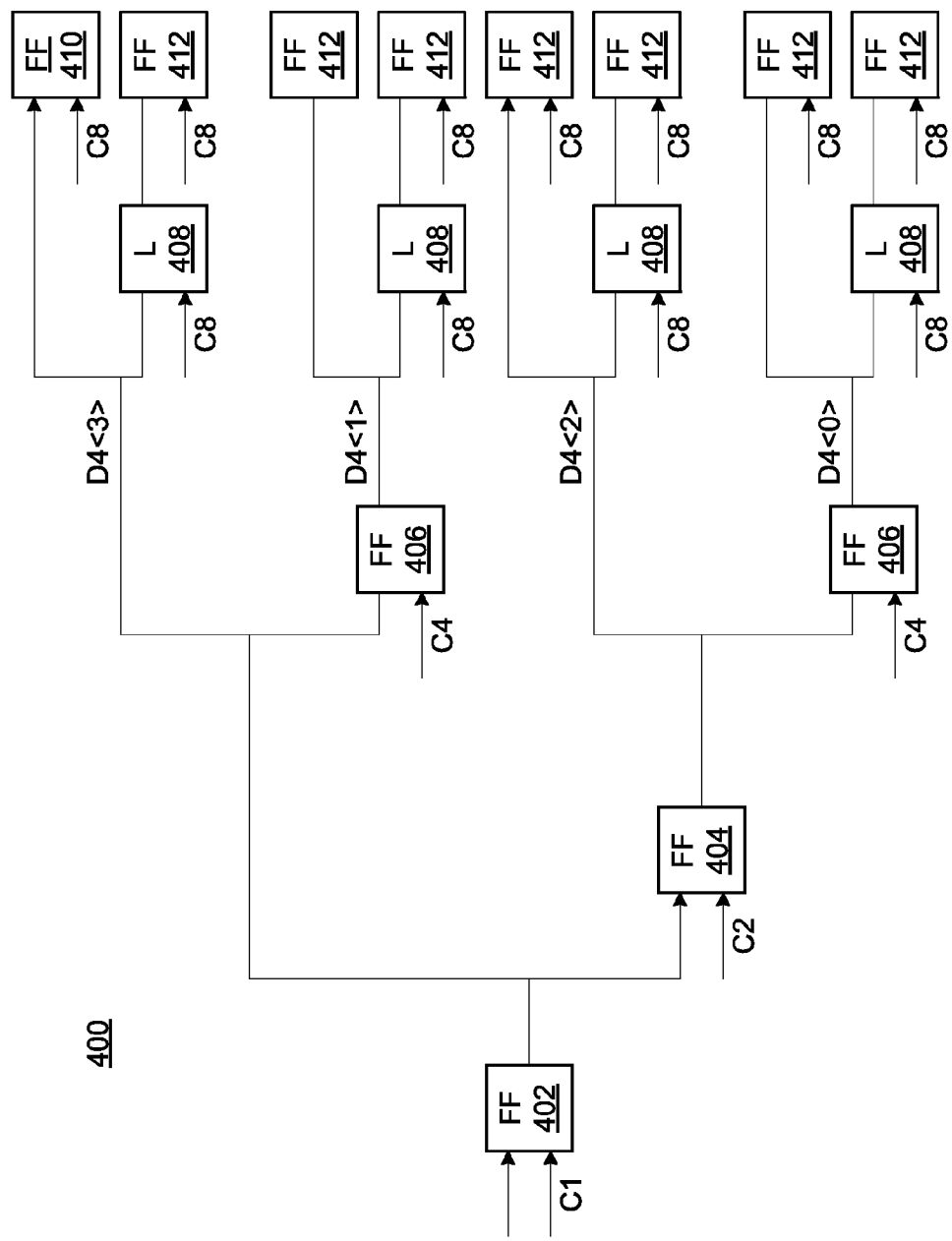
FIG. 6 is a block diagram of an 8-bit modified-tree deserializer in accordance with the present principles.

Referring now to FIG. 6, an eight-bit modified tree deserializer 400 is shown. The eight-bit deserializer 400 applies the same principles shown above with respect to the four-bit deserializer 200. In particular, the input flip-flop 402 samples data at a clock rate C1. The input flip-flop 402 is directly sampled by a last-bit flip-flop 410, while the other output flip-flops 412 obtain their values from the modified tree structure. Like in the smaller deserializer discussed above, the modified tree hierarchy distributes bits from the input flip-flop 402 to second-level flip-flop 404, third-level flip-flops 406, delay latches 408, and output flip-flops 412. The latency for the eight-bit deserializer 400 is the same as for the four-bit deserializer, and the power use is $26P_{FFC8}$. This compares to the 8-bit shift register power consumption of $72P_{FFC8}$—a substantial improvement.

Although only four-bit and eight-bit deserializers are shown herein, it should be understood that the present principles may be extended to any number of bits. In the deserializers described above the clocks are well aligned, meaning that the delays between C1 and C2, C2 and C4, and C4 and C8 are less than the clock-to-q delay of the flip-flops. The timing waveforms shown above are valid under this assumption but, in many practical cases, it will not be feasible to generate well-aligned clocks. For example, a clock divider delay could be more than the clock-to-q delay of the flip-flops. Furthermore, the delay between C1 and the sub-rate clocks could vary due to process, voltage, and temperature variations. The present embodiments may instead be configured to use skewed clocks, where flip-flops that are driven by clocks other than the destination sub-rate clocks are actually driven by the inverted clock. So if, for example, C2 is a half-rate clock, C2B would be a clock running at the same frequency but with an inverted waveform. In skewed-clock embodiments then, the clocks provided to each flip-flop other than the output flip-flops are triggered on an inverted clock relative to the clock provided to the output flip flops. Equivalently, the inverted clock may be simulated by triggering on a falling edge of the waveform instead of a rising edge, or vice versa. This provides reliable operation without needing precise alignment of the clocks.

In addition, the full-rate input flip-flops discussed above may be replaced by other types of front-end interfaces. In particular, if the delay information of the input signal is well-known and predictable, the input flip-flops may be removed. If the input data signal is a small analog signal, the full-rate input flip-flops help amplify the analog signal and slice it to a full-rail digital signal. When the data rate is very high, however, the front-end flip-flop can become particularly large and power-hungry, making a sub-rate front-end interface more practical.

Figure 7:
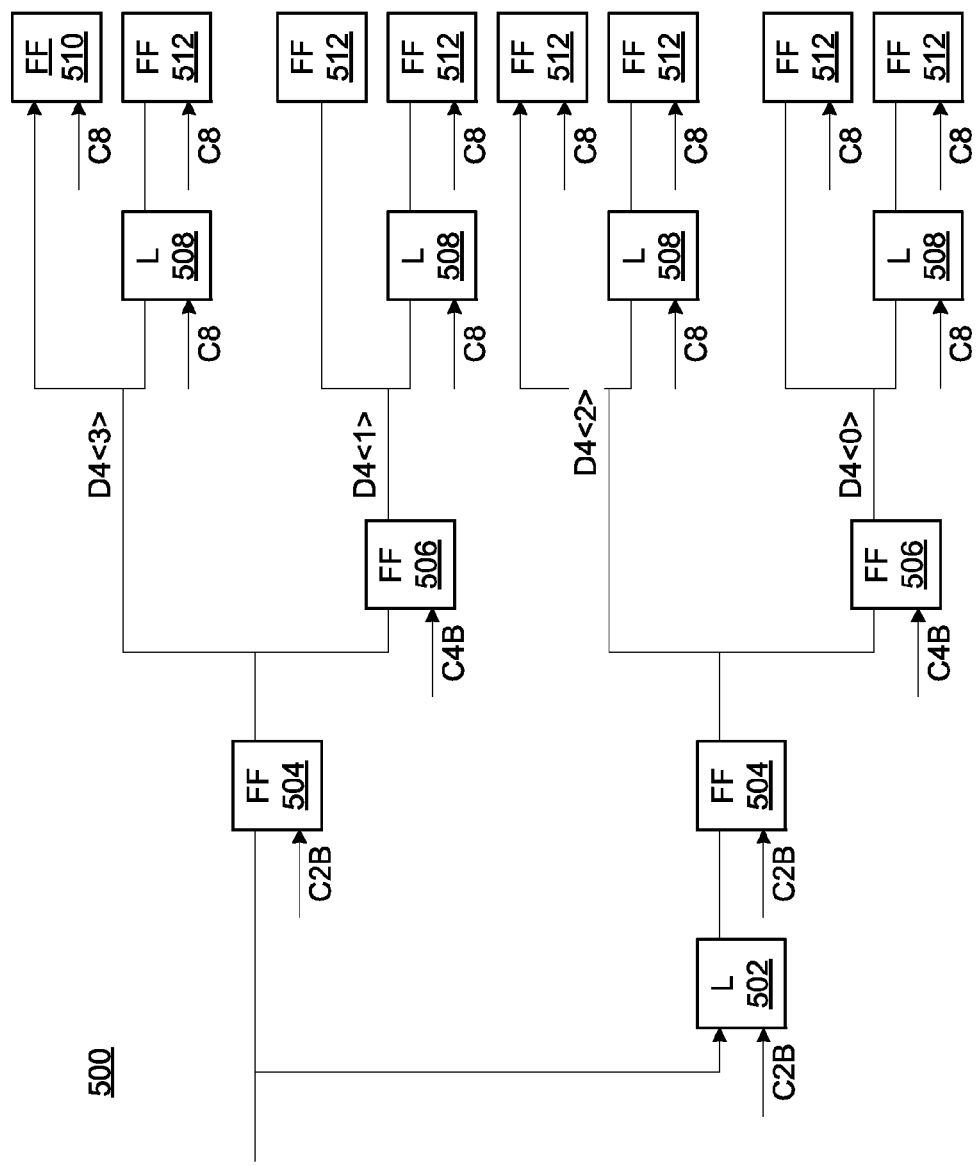
FIG. 7 is a block diagram of an 8-bit modified-tree deserializer having a half-rate front end interface and skewed clocks in accordance with the present principles.

Referring now to FIG. 7, a data serializer 500 with a half-rate front-end interface and skewed clocks is shown. The input signal is deserialized first into two half-rate tree deserializers using delay latch 502 and flip-flops 504, each running with an inverted half-rate clock C2B. Following the top branch, the last bit is still directly sampled from the input flip-flop 504 at output flip-flop 510. The remaining bits are further deserialized at flip-flops 506, triggered by inverted quarter-rate clocks C4B, and finally broken out into individual bits at output flip-flops 512 by way of delay latches 508. The power consumption of this embodiment is $24P_{FFC8}$.

Figure 8:
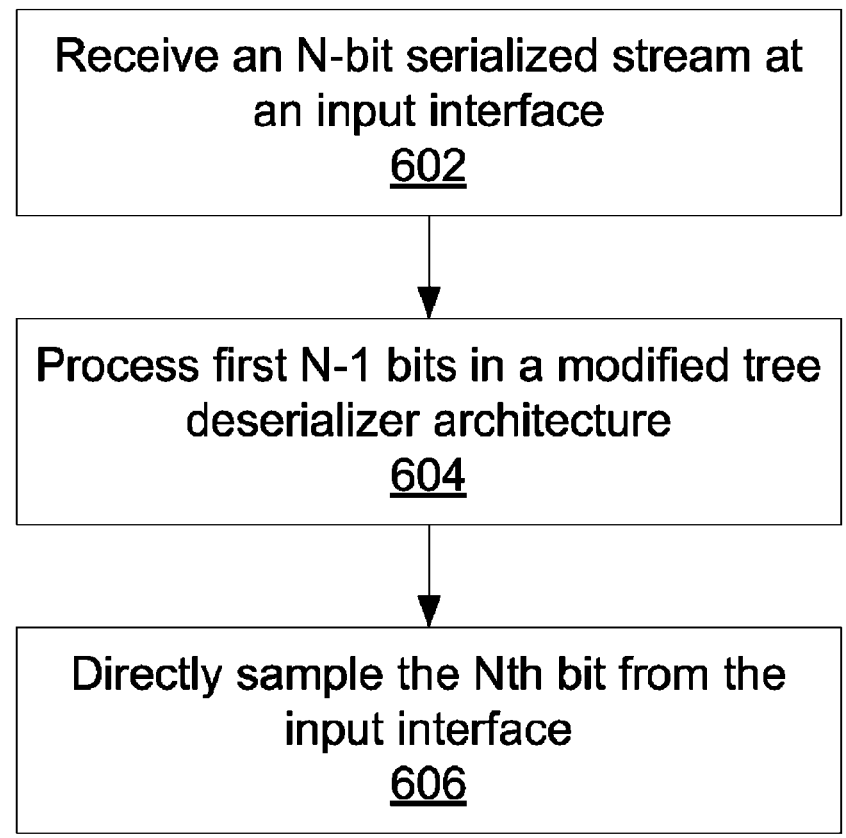
FIG. 8 is a block/flow diagram of a method of deserializing a data stream in accordance with the present principles.

Referring now to FIG. 8, a method for deserializiation is shown. Block 602 receives an N-bit serialized stream at an input interface. Following the examples above, the N-bit serialized stream may be an 8-bit stream and the input interface may be input flip-flop 402 or may be the half-rate front-end formed by latch 502 and flip-flops 504. Block 604 processes the first N−1 bits in a modified tree deserializer structure as shown above in FIGS. 4, 6, and 7 and as shown generally as block 104 in FIG. 1. Block 606 directly samples the Nth bit from the input interface using, for example, the latest-bit flip-flops 106, 210, 410, or 510.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for a low latency data deserializer (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A deserializer, comprising:
   an input interface configured to receive an N-bit serialized stream at a source clock frequency;
   a modified-tree deserializing architecture that receives the first N−1 bits of the serialized stream from the input interface and generates N−1 parallel outputs corresponding to the first N−1 bits; and
   a last-bit flip-flop that directly samples the input interface to obtain an Nth bit, such that all N bits are available within one source clock cycle after the Nth bit arrives at the input interface.

2. The deserializer of claim 1, wherein the input interface is a flip-flop triggered at the source clock frequency.

3. The deserializer of claim 1, wherein the input interface is a deserializer block triggered at half the source clock frequency.

4. The deserializer of claim 1, wherein the last-bit flip-flop is triggered at sub-rate frequency that is 1/N of the source clock frequency.

5. The deserializer of claim 1, wherein the modified-tree deserializing architecture comprises N−1 output flip-flop triggered at UN of the source clock frequency.

6. The deserializer of claim 5, wherein all flip-flops other than the N−1 output flip-flops and the last-bit flip-flop are triggered on inverted waveforms.

7. The deserializer of claim 5, wherein all flip-flops other than the N−1 output flip-flops and the last-bit flip-flop are triggered on an edge opposite to that of the N−1 output flip-flops.

8. The deserializer of claim 1, wherein each flip-flop comprises a master and a slave latch, with the slave latch being triggered on an inverted waveform with respect to the master latch.

9. A deserializer, comprising:
an input flip-flop triggered at a source frequency, configured to receive an N-bit serialized stream at the source clock frequency;
a modified-tree deserializing architecture, comprising N−1 output flip-flop triggered at 1/N of the source clock frequency, that receives the first N−1 bits of the serialized stream from the input interface and generates N−1 parallel outputs corresponding to the first N−1 bits; and
a last-bit flip-flop, triggered at sub-rate frequency that is 1/N of the source clock frequency, that directly samples the input interface to obtain an Nth bit, such that all N bits are available within one source clock cycle after the Nth bit arrives at the input interface.

10. The deserializer of claim 9, wherein all flip-flops other than the N−1 output flip-flops and the last-bit flip-flop are triggered on inverted waveforms.

11. The deserializer of claim 9, wherein all flip-flops other than the N−1 output flip-flops and the last-bit flip-flop are triggered on an edge opposite to that of the N−1 output flip-flops.

12. The deserializer of claim 9, wherein each flip-flop comprises a master and a slave latch, with the slave latch being triggered on an inverted waveform with respect to the master latch.

13. A deserialization method, comprising:
receiving an N-bit serialized stream at an input interface at a source clock frequency;
deserializing the first N−1 bits of the received N-bit serialized stream using a modified-tree deserializing architecture to generate N−1 parallel outputs;
directly sampling the input interface to obtain an Nth bit; and
providing an N-bit parallel output corresponding to the N-bit serialized stream within one source clock cycle after the Nth bit arrives at the input interface.

14. The method of claim 13, wherein the input interface is a flip-flop triggered at the source clock frequency.

15. The method of claim 13, wherein the input interface is a deserializer block triggered at half the source clock frequency.

16. The method of claim 13, wherein directly sampling the input interface comprises triggering a last-bit flip-flop at sub-rate frequency that is 1/N of the source clock frequency.

17. The method of claim 13, deserializing the first N−1 bits comprises triggering N−1 output flip-flops at 1/N of the source clock frequency.

18. The method of claim 17, wherein all flip-flops other than the N−1 output flip-flops and a last-bit flip-flop are triggered on inverted waveforms or are triggered on an edge opposite to that of the N−1 output flip-flops.

19. The method of claim 17, wherein all flip-flops other than the N−1 output flip-flops and the last-bit flip-flop or are triggered on an edge opposite to that of the N−1 output flip-flops.

20. The method of claim 17, wherein each flip-flop comprises a master and a slave latch, with the slave latch being triggered on an inverted waveform with respect to the master latch.

* * * * *